(12) United States Patent
Needham et al.

(10) Patent No.: US 11,949,368 B2
(45) Date of Patent: *Apr. 2, 2024

(54) SOLAR TRACKER SYSTEM

(71) Applicant: FCX Solar LLC, Mont Vernon, NH (US)

(72) Inventors: Christopher Thomas Needham, Mountain View, HI (US); Frank Carl Oudheusden, Mont Vernon, NH (US)

(73) Assignee: FCX Solar LLC, Mont Vernon, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/160,020

(22) Filed: Jan. 27, 2021

(65) Prior Publication Data
US 2021/0159848 A1    May 27, 2021

Related U.S. Application Data

(63) Continuation of application No. 17/144,479, filed on Jan. 8, 2021, which is a continuation of application
(Continued)

(51) Int. Cl.
*H02S 20/32* (2014.01)
*H01L 31/0475* (2014.01)
(Continued)

(52) U.S. Cl.
CPC .......... *H02S 20/32* (2014.12); *H01L 31/0475* (2014.12); *H02S 30/00* (2013.01);
(Continued)

(58) Field of Classification Search
CPC .. F16F 9/56; H02S 20/32; H02S 20/30; F24S 2025/018; F24S 2030/115; F24S 2030/19
See application file for complete search history.

(56) References Cited

U.S. PATENT DOCUMENTS 1,028,400 A    6/1912 Stanton
4,108,154 A    8/1978 Nelson
(Continued)

FOREIGN PATENT DOCUMENTS

CN    203656042 U    6/2014
CN    107387648 A  * 11/2017
(Continued)

OTHER PUBLICATIONS

Machine translation of CN107387648A (Year: 2017).*
(Continued)

*Primary Examiner* — Ryan S Cannon
(74) *Attorney, Agent, or Firm* — Perkins Coie LLP; Colin Fowler

(57) ABSTRACT

A photovoltaic system includes a collection of photovoltaic modules, a base supporting the collection of photovoltaic modules, and a damper coupled between the collection of photovoltaic modules and the base. The damper resists movement of the photovoltaic modules relative to the base. The damper has a first damping ratio when the collection of photovoltaic modules moves at a first rate relative to the base and a second damping ratio when the collection of photovoltaic modules moves at a second rate relative to the base, and the damper passively transitions from the first damping ratio to the second damping ratio.

7 Claims, 3 Drawing Sheets

Related U.S. Application Data

No. 17/077,840, filed on Oct. 22, 2020, now Pat. No. 11,837,990, which is a continuation of application No. 16/991,826, filed on Aug. 12, 2020, now Pat. No. 10,848,097, which is a continuation of application No. 16/443,535, filed on Jun. 17, 2019, now Pat. No. 10,903,782, which is a continuation of application No. 16/274,557, filed on Feb. 13, 2019, now Pat. No. 10,630,231.

(60) Provisional application No. 62/629,931, filed on Feb. 13, 2018.

(51) Int. Cl.
| | | |
|---|---|---|
| *H02S 30/00* | (2014.01) | |
| *H02S 30/10* | (2014.01) | |
| *F16M 11/10* | (2006.01) | |
| *F16M 11/18* | (2006.01) | |
| *G01M 9/04* | (2006.01) | |
| *G01M 9/06* | (2006.01) | |

(52) U.S. Cl.
CPC .............. *H02S 30/10* (2014.12); *F16M 11/10* (2013.01); *F16M 11/18* (2013.01); *F16M 2200/021* (2013.01); *G01M 9/04* (2013.01); *G01M 9/06* (2013.01)

(56) References Cited

U.S. PATENT DOCUMENTS

| | | | |
|---|---|---|---|
| 4,148,200 | A | 4/1979 | Schallhorn et al. |
| 4,328,789 | A | 5/1982 | Nelson |
| 4,632,228 | A | 12/1986 | Oster et al. |
| 4,759,428 | A | 7/1988 | Seshimo |
| 5,193,655 | A | 3/1993 | Sasaki et al. |
| 7,584,829 | B2 | 9/2009 | Schmidt |
| 8,459,249 | B2 | 6/2013 | Corio |
| 8,590,678 | B2 | 11/2013 | Bombrys et al. |
| 8,800,729 | B2 | 8/2014 | Yabe et al. |
| 9,067,471 | B2 | 6/2015 | Tuts et al. |
| 9,677,576 | B2 | 6/2017 | Pawelski et al. |
| 9,863,450 | B1 | 1/2018 | Koschel et al. |
| 10,539,201 | B2 | 1/2020 | Griffin et al. |
| 10,630,231 | B2 | 4/2020 | Needham et al. |
| 10,648,528 | B2 | 5/2020 | Kull et al. |
| 10,848,097 | B1 | 11/2020 | Needham et al. |
| 10,903,782 | B2 | 1/2021 | Needham et al. |
| 11,187,299 | B1 | 11/2021 | Mao et al. |
| 2005/0133319 | A1 | 6/2005 | Wilhelm |
| 2005/0284467 | A1 | 12/2005 | Patterson |
| 2010/0095955 | A1 | 4/2010 | Carrasco |
| 2012/0125054 | A1* | 5/2012 | Vincent ................ F16F 9/0218 188/297 |
| 2012/0174962 | A1 | 7/2012 | Koningstein et al. |
| 2013/0217524 | A1 | 8/2013 | Antchak et al. |
| 2013/0326969 | A1 | 12/2013 | Kienholz et al. |
| 2015/0234031 | A1 | 8/2015 | Corio |
| 2016/0261224 | A1 | 9/2016 | Madrone et al. |
| 2016/0329860 | A1 | 11/2016 | Kalus et al. |
| 2017/0037668 | A1 | 2/2017 | Kruedener et al. |
| 2017/0074294 | A1 | 3/2017 | Paweski et al. |
| 2018/0013380 | A1 | 1/2018 | Childress et al. |
| 2018/0226915 | A1* | 8/2018 | Henderson ............ F16H 19/001 |
| 2019/0052224 | A1 | 2/2019 | Schatz et al. |
| 2019/0072150 | A1* | 3/2019 | Kull ....................... F16F 9/512 |
| 2019/0253021 | A1 | 8/2019 | Needham et al. |
| 2019/0319578 | A1 | 10/2019 | Needham et al. |
| 2020/0162015 | A1 | 5/2020 | Upfill-Brown et al. |
| 2021/0044252 | A1 | 2/2021 | Needham et al. |
| 2021/0071914 | A1 | 3/2021 | Worden et al. |
| 2021/0080345 | A1 | 3/2021 | Mcgranahan et al. |
| 2021/0167721 | A1 | 6/2021 | Chaouki Almagro et al. |
| 2021/0277973 | A1 | 9/2021 | Kull et al. |
| 2021/0311507 | A1 | 10/2021 | Needham et al. |
| 2022/0294384 | A1 | 9/2022 | Zhao et al. |

FOREIGN PATENT DOCUMENTS

| | | | | |
|---|---|---|---|---|
| DE | 2419424 | A1 | 11/1975 | |
| JP | 2014114838 | A | 6/2014 | |
| KR | 20101858934 | B1 | 5/2018 | |
| KR | 2018108058 | A | * 10/2018 | ............... F16F 9/34 |
| KR | 20180108058 | A | 10/2018 | |
| WO | 2018009634 | A1 | 1/2018 | |

OTHER PUBLICATIONS

Partial Machine Translation of Frahm DE-2419424-A1 (Year 2020).
FTC Solar, Inc.; "Voyager Tracker"; Doc: 02-8-001-B; 2020; 2 pages.
Bowman, Mitch, et al., Bowman, Mitch et al.; "How Design of PV Trackers Accommodates Large-Format Modules"; https://www.preentechmedia.com/webinars/webinar/how-design-of-pv-trackers-accommodates-large-format-modules; GTM Webinar; Feb. 18, 2021; 3 pages., Feb. 18, 2021.
Sunedison, AP90 Single-Axis Tracker, data sheet, Oct. 2013.
FTC Solar, AP90 Solar Tracker, Oct. 2017.
FTC Solar, AP90 2.0 Single-Axis Tracker, 2017.
FTC Solar, Exhibit B US20100095955 Carrasco, claim chart.
FTC Solar, Exhibit C US20180013380 Childress, claim chart.
FTC Solar, Exhibit D CN203656042, claim chart.
FTC Solar, Exhibit E US20150234031 Corio, claim chart.
FTC Solar, Exhibit F U.S. Pat. No. 8,459,249 Corio, claim chart.
FTC Solar, Exhibit G US20160329860 Kalus, claim chart.
FTC Solar, Exhibit H-1 U.S. Pat. No. 10,648,528 Kull, claim chart.
FTC Solar, Exhibit H-2 U.S. Appl. No. 62/555,327 Kull, claim chart.
FTC Solar, Exhibit I US20050284467 Patterson, claim chart.
FTC Solar, Exhibit J U.S. Pat. No. 9,677,576 Pawelski, claim chart.
FTC Solar, Exhibit K Secondary Obviousness References, claim chart.
Kull, Systems and Methods for Damping Photovoltaic Panel Arrays, priority application to U.S. Pat. No. 10,648,528, Sep. 7, 2017, U.S. Appl. No. 62/555,327, United States Patent and Trademark Office (USPTO), US.
Machine Translation of Hangzhou Versol Solar Co., LTD CN-203656042-U (Year 2021).
Machine Translation of Watanabe JP-2014114838 (Year 2021).
FTC Solar, Inc., "Voyager Tracker", FTC Solar, Inc.; "Voyager Tracker"; Doc: 02-8-001-B; 2020;, 2020, 2 pp.
Cain ("Wind Loads on Utility Scale Solar PV Power Plants"), 2015 SEAOC Convention Proceedings (Year: 2015).

* cited by examiner

ID: 11,949,368 B2

SOLAR TRACKER SYSTEM

CROSS-REFERENCE TO RELATED APPLICATION

This application is a continuation of U.S. patent application Ser. No. 17/144,479, filed Jan. 8, 2021, which is a continuation of U.S. patent application Ser. No. 17/077,840, filed Oct. 22, 2020 which is a continuation of U.S. patent application Ser. No. 16/991,826, filed Aug. 12, 2020, now U.S. Pat. No. 10,848,097, issued Nov. 24, 2020, which is a continuation of U.S. patent application Ser. No. 16/443,535, filed Jun. 17, 2019, now U.S. Pat. No. 10,903,782, issued Jan. 26, 2021, which is a continuation of U.S. patent application Ser. No. 16/274,557, filed Feb. 13, 2019, now U.S. Pat. No. 10,630,231, issued Apr. 21, 2020, which claims the benefit of U.S. Provisional Patent Application Ser. No. 62/629,931, filed Feb. 13, 2018. The aforementioned applications are incorporated herein by reference in their entirety.

TECHNICAL FIELD

The present application is related to solar tracker systems for solar panels.

BACKGROUND

Photovoltaic (PV) power systems frequently track the sun to various degrees to increase an amount of energy produced by the system. These trackers typically move photovoltaic modules to adjust an angle of incidence of the sunlight on the surface of the PV modules. In particular, trackers typically rotate the PV modules around an axis principally oriented north to south, tilting the modules to as much as 60 degrees towards the east and west and adjusting tilt within this range throughout the day. By tracking the position of the sun, PV power systems often produce 20-30% more energy than fixed-tilt systems.

A common configuration of horizontal single-axis trackers ("SAT") as described above includes a single actuator near the center of a row of PV modules, potentially with 80-120 modules tilted by a single actuator. The angle of tilt is defined by the position of the actuator, while a torque tube or other similar device transfers moments and positions the rest of the row at this tilt. However, environmental loading (wind, snow, dead load, etc.) can twist portions of a row away from the intended tilt angle. This effect requires design considerations that add cost in order to decrease risk of failures.

To reduce row twist, some PV systems may have shorter row lengths or more than one actuator per row. These approaches can reduce the risk of system failure from excessive row twist, but may increase the PV system cost as well as overhead and maintenance costs. Furthermore, when multiple actuators are used, the actuators within a row must communicate such that, for example, other actuators stop moving if one actuator fails. This communication can be by electronic, mechanical, or other means. However, this active control brings additional failure modes that must be considered in the design of the PV system.

The figures depict various embodiments of this disclosure for purposes of illustration only. One skilled in the art can readily recognize from the following discussion that alternative embodiments of the structures and methods illustrated herein can be employed without departing from the principles of the invention described herein.

DETAILED DESCRIPTION

Figure 1:
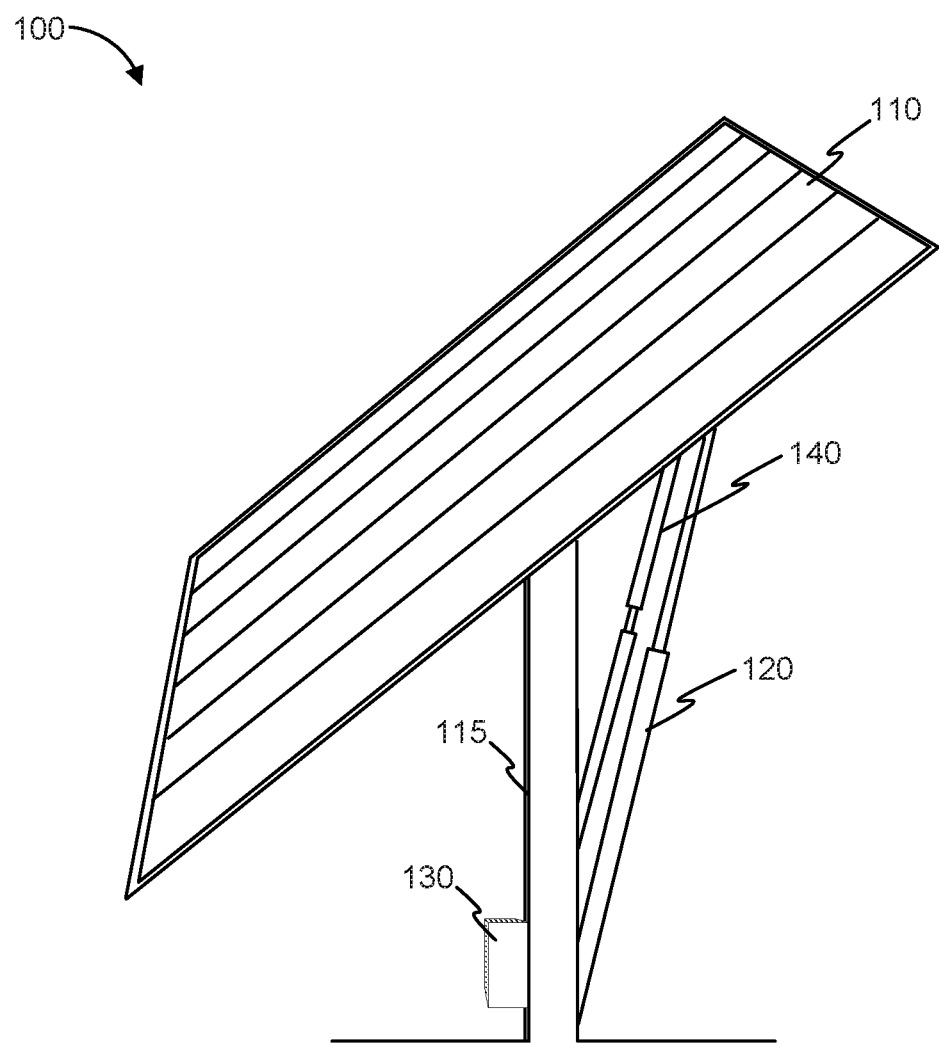
FIG. 1 illustrates a photovoltaic system, according to one embodiment.

FIG. 1 illustrates a photovoltaic (PV) system 100, according to one embodiment. As shown in FIG. 1, the PV system 100 may include a collection of PV modules 110, an actuator 120, a controller 130, and a damper 140. The PV system 100 is configured to generate electricity, and may be used alone or with other similar photovoltaic systems in, for example, a photovoltaic power station.

The collection of PV modules 110 includes an array of one or more photovoltaic modules configured to convert solar energy into electricity by the photovoltaic effect. The collection of PV modules 110 is rotatably anchored to a base 115, and may be coupled to a power grid, battery, or other power transmission or storage system. The amount of electricity produced by each photovoltaic module can be a function of at least the angle of incidence of light on the surface of the module, where more energy is captured when light is perpendicular to the surface (i.e., a zero-degree angle of incidence) than when light is incident at higher angles.

The actuator 120 is configured to rotate the collection of PV modules 110 around one or more axes. The actuator 120 may be a linear actuator coupled to the PV module collection 110 and a fixed position, such as the base 115. Increasing or decreasing the length of the linear actuator changes a tilt angle of the collection of PV modules 110 with respect to the base 115. Other types of actuators may be used in other embodiments. For example, the PV module collection 110 may be mounted on an axle and a rotary actuator may drive the axle to rotate the collection of PV modules 110 around an axis. In one embodiment, the actuator 120 rotates the collection of PV modules 110 around an axis centered at the base 115 and geographically oriented substantially north to south, such that a surface of the PV module 110 can be tilted between east- and west-facing angles. The actuator 120 may also rotate the collection of PV modules 110 around additional axes (e.g., an east-west axis), or the photovoltaic system 100 may include one or more additional actuators to cause other movements of the collection of PV modules 110.

The controller 130 drives the actuator 120 to set a tilt angle of the collection of PV modules 110. To increase the amount of energy captured by the collection of PV modules 110, the controller 130 may set the tilt angle based on a position of the sun. In one embodiment, the controller 130 is coupled to a light sensor (not shown in FIG. 1) to detect a position of the sun during the day. As the day progresses, the controller 130 may drive the actuator 120 to move the PV module collection 110 to follow the detected movement of the sun. Thus, the controller 130 drives the actuator 120 to move the PV module collection 110 from an orientation facing substantially east to an orientation facing substantially west. Overnight, the controller 130 may drive the actuator 120 to return the collection of PV modules 110 to an east-facing orientation in preparation for sunrise the next morning, or the controller 130 may drive the actuator 120 to rotate the PV module collection 110 in response to detecting sunlight in the east. The controller 130 may alternatively control the tilt angle of the PV module collection 110 without light feedback, for example based on time of day.

The damper 140 provides damping for the PV system 100, resisting movement of the PV modules 110 relative to the base 115. Damping by the damper 140 can mitigate dynamic wind loading or other vibrational loads applied to the PV system 100. Wind loading can induce motion in PV system 100, for example rotating the collection of PV modules 110 around the base at a velocity multiple orders of magnitude higher than the motion induced by the actuator 120. Although the damper 140 is shown in FIG. 1 as a component separate from the actuator 120 for purposes of illustration, the damper 140 may be incorporated into or positioned concentric to the actuator 120.

The damper 140 has a variable damping ratio. The damper 140 can have at least a first damping ratio under a first operating condition and a second damping ratio under a second operating condition. Different damping ratios may be advantageous for different operating states. For example, a high damping ratio enables the damper 140 to dissipate more energy, and therefore better mitigates undesired oscillations of the PV system 100 under wind loading than a low damping ratio. A high damping ratio also potentially enables the damper 140 to bear a portion of the static load of the PV module collection 110 and dynamic loads caused by environmental conditions, reducing the load on the actuator 120. However, a high damping ratio may cause the damper 140 to provide enough resistance to the movement of the actuator 120 cause the PV module 110 to twist away from its intended orientation. As a result of the modified angle of incidence caused by this "propeller effect," the collection of PV modules 110 may generate less electricity. If twisted more than a few degrees, operation of the collection of PV modules 110 may fall outside acceptable specifications. A low damping ratio, in contrast, reduces the twist by providing lower resistance to movement of the actuator 120.

Accordingly, the damper 140 can have a first damping ratio while the PV modules 110 move at a first rate. The damper 140 can have a second damping ratio, higher than the first damping ratio, during a second movement rate of the PV modules 110 that is higher than the first rate. For example, the damping ratio can be relatively low when the PV modules 110 move at low speeds relative to the base 115 (e.g., while the actuator 120 is moving the collection of PV modules 110 without high environmental loading) and relatively high when the PV modules 110 move at higher speeds relative to the base (e.g., under dynamic wind loading). The higher damping ratio of the damper 140 may enable the damper 140 to support a portion of the loading on the PV system 100, including the static load of the PV module collection 110 (e.g., the weight of the collection 110) and static or dynamic loading caused by environmental conditions such as wind, snow, or dust. The lower damping ratio reduces the damper's resistance to movement caused by the actuator 120. The damping ratio of the damper 140 can change passively based on the operating state of the actuator 120, such as the actuation rate. The damping ratio may therefore be adjusted without active control by, for example, the controller 130.

The higher damping ratio can have a value greater than 1 (such that the PV system 100 is overdamped), while not fully locking up the PV system 100 under loading by wind or other environmental conditions. That is, the damper 140 under the higher damping ratio allows some movement of the system 100 while providing resistance against that movement. However, in some embodiments, the damper 140 may fully lock up under high environmental loading.

Figure 2A:
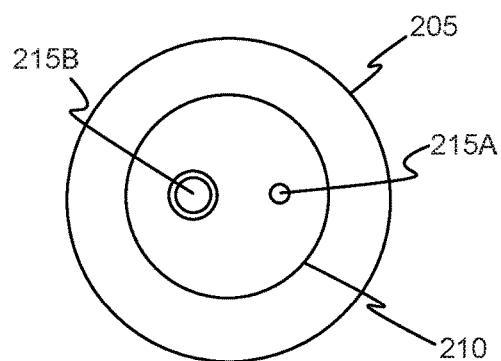
FIGS. 2A-2C illustrate an example damper.
Figure 2B:
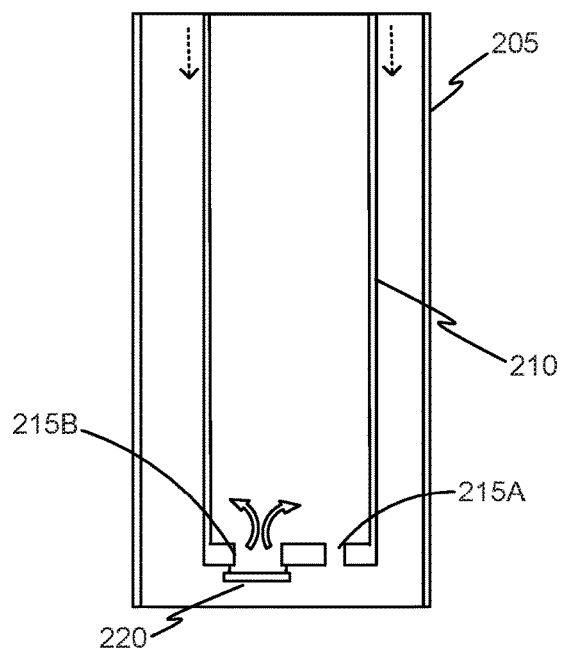
Figure 2C:
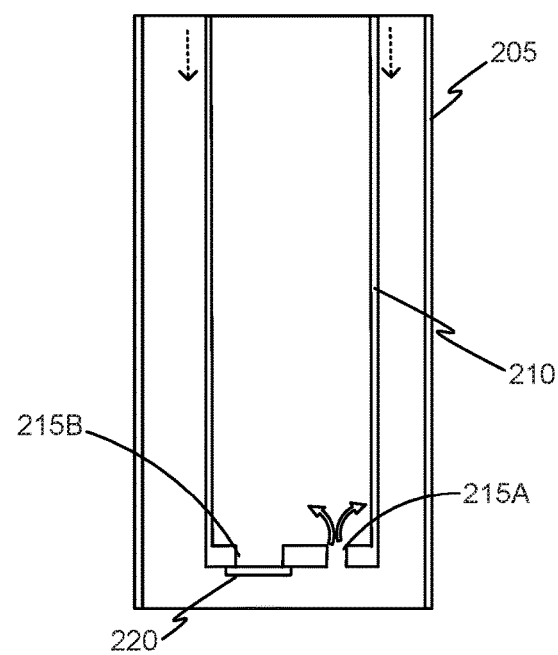

FIGS. 2A-2C show one example damper 140. FIG. 2A is a bottom cutaway view of the damper 140, while FIGS. 2B-2C are a side cutaway view of the damper. The damper 140 can include a damper piston 210 that can move through fluid contained in a damper chamber 205. Any fluid or mixture of fluids can be contained within the damper chamber 205, such as air, water, or oil. The damper piston 210 includes at least two ports 215 that, when open, allow fluid to flow between the damper piston and damper chamber. The ports 215 are shown in FIG. 2A as being openings in a bottom end of the damper piston, but the ports can be located anywhere in the damper piston.

The two ports 215 can include at least one smaller diameter port 215A and at least one larger diameter port 215B. The larger diameter port 215A can be controlled by a valve 220. When the damper piston 210 moves through the fluid at low speeds (e.g., while the PV modules 110 are rotated at a low speed by the actuator 120), the fluid can flow freely through the large diameter port 215B and provide little resistance to the movement of the piston. FIG. 2B illustrates an example of the piston 210 moving at a low speed through the fluid. As shown in FIG. 2B, the valve 220 is open and fluid can pass through the larger diameter port 215B to flow into or out of the damper piston 210. At higher speeds, the valve 220 is pushed closed and the fluid is forced through the smaller diameter port 215A. The resistance provided by the fluid flow through the small diameter port 215A increases the effective damping ratio of the damper 140. FIG. 2C illustrates an example of the piston 210 moving at a high speed through the fluid. As shown in FIG. 2C, the valve 220 is closed and fluid is forced through the smaller diameter port 215A to flow into or out of the damper piston 210.

The damper 140 may have configurations other than that shown in FIGS. 2A-2C and may passively regulate the damping ratio in other manners. For example, valves may regulate fluid flow through multiple equally or differently sized ports in the damper piston. At lower speeds, the valves are open to allow the fluid to flow through several or all of the ports. At higher speeds, the valves close the port and force the fluid to flow through a smaller number of ports. As another example, the damper 140 may include a non-Newtonian fluid that has lower viscosity at low piston speeds and higher viscosity at high piston speeds.

Figure 3:
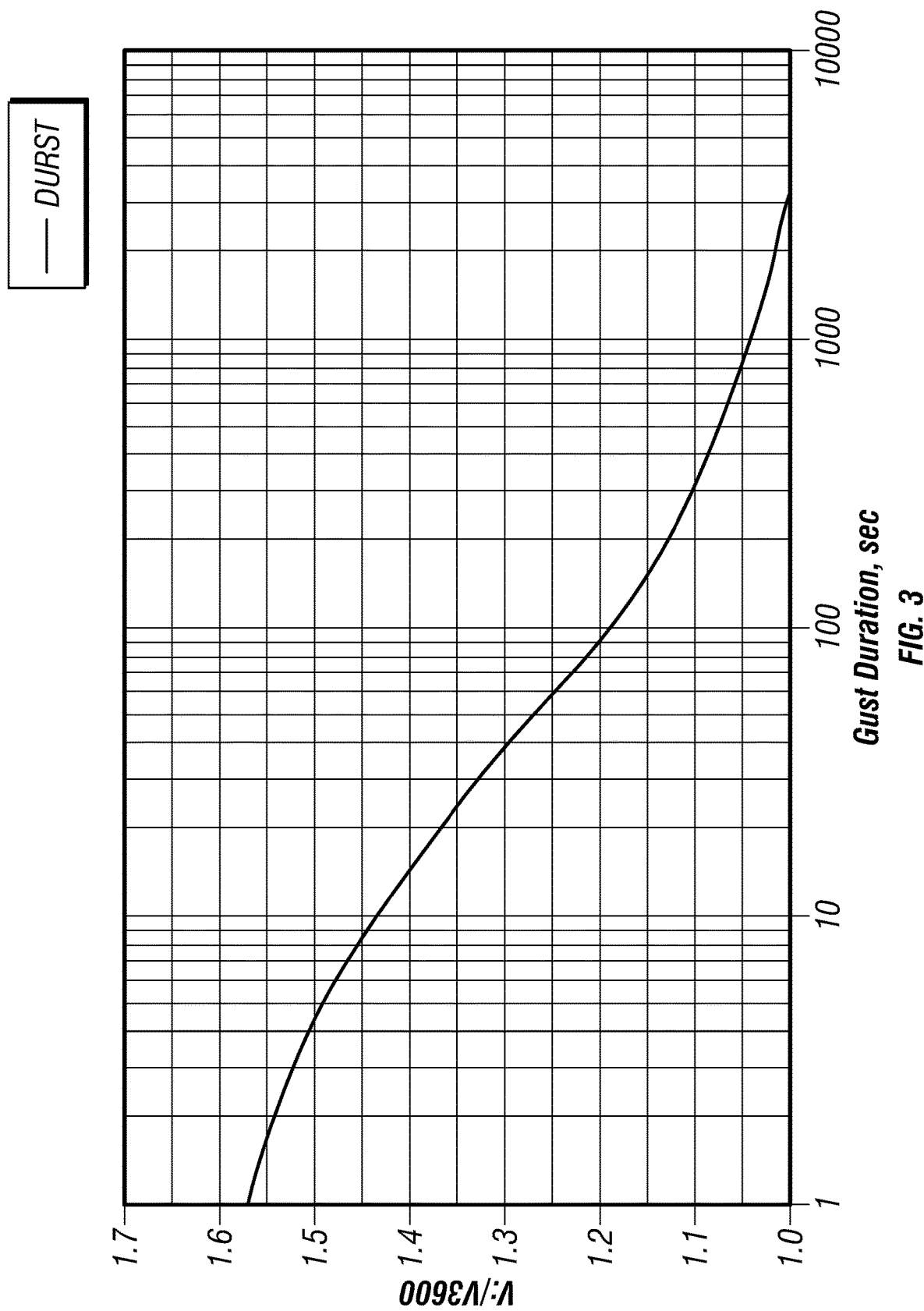
FIG. 3 illustrates an example Durst curve.

The PV system 100 may be designed based on wind speed in the area where the system will be installed. In particular, the PV system 100 may be designed to withstand expected peak loads from the area's wind conditions following a protocol such as ASCE 7. FIG. 3 illustrates an example Durst curve, which relates average wind speed to gust duration, that may be used in such protocols. As shown in FIG. 3, average wind speeds are higher for shorter measurements of gust duration than for longer measurements. Because the damper 140 has a higher damping ratio under wind loading and bears a portion of the load on the collection of PV modules 110, the PV system 100 may be designed based on longer gust durations—and therefore lower wind speeds—than photovoltaic systems lacking the damper 140. Furthermore, while the Durst curve shown in FIG. 3 assumes free, unobstructed wind speed, the PV system 100 will likely experience turbulent air flow as dynamic winds move around the structure. The average moments on the PV system 100 under turbulent flow may be even lower across longer gust durations than predicted by the Durst curve. Accordingly, at least one of the base 115, the actuator 120, and the PV modules 110 can be designed to withstand an average value of moments applied to the PV system 100 across a specified duration of time. This duration of time can be calculated based on wind tunnel testing, and can be, for example, approximately equivalent to a response time of the PV system 100 under target environmental loads. The design for lower wind speeds may reduce the amount of material used to construct the base 115, the actuator 120, and the collection of PV modules 110, and may reduce overhead and maintenance costs for the PV system 100.

In some embodiments, the higher damping ratio of the damper 140 is designed under wind tunnel testing to achieve a specified response time of the PV system 100 under high environmental loads. Because the higher damping ratio resists movement of the actuator 120, it may take longer for the actuator 120 to move the PV modules 110 to a specified angle under the higher damping ratio than under the lower damping ratio. The higher damping ratio can be selected such that the movement of the PV modules 110 through a designated angular distance (relative to the base 115) will take a specified amount of time if the PV system 100 is subjected to a specified amount of wind loading that is enough environmental loading to cause the damper 140 to transition to the higher damping ratio. For example, the higher damping ratio can be selected under wind tunnel testing such that the actuator moves the PV modules 110 thirty degrees relative to the base in 60 seconds while the PV system 100 is subjected to a specified amount of wind loading above a threshold wind speed. The higher damping ratio can be selected to allow faster or slower movements of the PV modules 110, such as 10 seconds, 30 seconds, or 120 seconds.

Other Considerations

The foregoing description of various embodiments of the claimed subject matter has been provided for the purposes of illustration and description. It is not intended to be exhaustive or to limit the claimed subject matter to the precise forms disclosed. Many modifications and variations can be apparent to one skilled in the art. Embodiments were chosen and described in order to best describe the principles of the invention and its practical applications, thereby enabling others skilled in the relevant art to understand the claimed subject matter, the various embodiments, and the various modifications that are suited to the particular uses contemplated.

While embodiments have been described in the context of fully functioning computers and computer systems, those skilled in the art can appreciate that the various embodiments are capable of being distributed as a program product in a variety of forms, and that the disclosure applies equally regardless of the particular type of machine or computer-readable media used to actually effect the distribution.

Although the above Detailed Description describes certain embodiments and the best mode contemplated, no matter how detailed the above appears in text, the embodiments can be practiced in many ways. Details of the systems and methods can vary considerably in their implementation details, while still being encompassed by the specification. As noted above, particular terminology used when describing certain features or aspects of various embodiments should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless those terms are explicitly defined herein. Accordingly, the actual scope of the invention encompasses not only the disclosed embodiments, but also all equivalent ways of practicing or implementing the embodiments under the claims.

The language used in the specification has been principally selected for readability and instructional purposes, and it cannot have been selected to delineate or circumscribe the inventive subject matter. It is therefore intended that the scope of the invention be limited not by this Detailed Description, but rather by any claims that issue on an application based hereon. Accordingly, the disclosure of various embodiments is intended to be illustrative, but not limiting, of the scope of the embodiments, which is set forth in the following claims.

What is claimed is:

1. A photovoltaic tracker system, comprising:
   an actuator coupled to a collection of photovoltaic modules and configured to rotate the collection of photovoltaic modules around an axis; and
   a linear damper coupled to the collection of photovoltaic modules, wherein the damper has a variable damping ratio that varies passively between multiple damping ratio stages based on a speed of the system, wherein a damping ratio stage of the multiple damping ratio stages having a greater damping ratio corresponds to a faster speed of the system.

2. The photovoltaic tracker system of claim 1, further comprising:
   a controller in electronic communication with the actuator and configured to drive the actuator to rotate the photovoltaic module around the axis;
   wherein the damping ratio of the damper is set independently of the controller.

3. The photovoltaic tracker system of claim 1, wherein the damper has a first damping ratio while the actuator is rotating the photovoltaic modules and a second damping ratio under wind loading of the photovoltaic module, wherein the second damping ratio is higher than the first damping ratio.

4. The photovoltaic tracker system of claim 3, wherein the second damping ratio causes the damper to be fully locked against movement of the photovoltaic modules relative to a base.

5. The photovoltaic tracker system of claim 3, wherein the damper further comprises:
   a chamber;
   a piston;
   a first port;
   a second port; and
   a valve, configured to open and close the second port.

6. The photovoltaic tracker system of claim 1, wherein the damper supports at least a portion of a load placed on the photovoltaic system by an environmental condition.

7. The photovoltaic tracker system of claim 1, wherein the actuator is configured to move the collection of photovoltaic modules to change an angle of the collection of photovoltaic modules relative to a base.

* * * * *